(12) United States Patent
Liu et al.

(10) Patent No.: US 11,309,279 B2
(45) Date of Patent: Apr. 19, 2022

(54) PACKAGE STRUCTURE OF WAFER-LEVEL SYSTEM-IN-PACKAGE

(71) Applicant: Ningbo Semiconductor International Corporation, Ningbo (CN)

(72) Inventors: Mengbin Liu, Ningbo (CN); Hailong Luo, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 34 days.

(21) Appl. No.: 17/078,944

(22) Filed: Oct. 23, 2020

(65) Prior Publication Data
US 2021/0043601 A1 Feb. 11, 2021

Related U.S. Application Data

(60) Division of application No. 16/206,037, filed on Nov. 30, 2018, now Pat. No. 10,861,821, which is a (Continued)

(30) Foreign Application Priority Data

May 3, 2018 (CN) .......................... 201810416799.0

(51) Int. Cl.
*H01L 21/56* (2006.01)
*H01L 21/768* (2006.01)
(Continued)

(52) U.S. Cl.
CPC ............ *H01L 24/94* (2013.01); *H01L 21/561* (2013.01); *H01L 21/565* (2013.01);
(Continued)

(58) Field of Classification Search
CPC .............. H01L 24/94; H01L 21/76898; H01L 21/561; H01L 21/565; H01L 25/0652;
(Continued)

(56) References Cited

U.S. PATENT DOCUMENTS

| 8,563,403 | B1 | 10/2013 | Farooq et al. |
| 2008/0079152 | A1 | 4/2008 | Tanaka et al. |
| 2015/0072444 | A1* | 3/2015 | La Tulipe, Jr. ..... H01L 21/2007 438/5 |

FOREIGN PATENT DOCUMENTS

| CN | 1959983 A | 5/2007 |
| CN | 101840871 A | 9/2010 |

(Continued)

*Primary Examiner* — Shih Tsun A Chou
(74) *Attorney, Agent, or Firm* — Anova Law Group, PLLC

(57) ABSTRACT

A wafer-level system-in-package (WLSiP) package structure is provided. The WLSiP package structure includes a device wafer, an adhesive layer, and a plurality of second chips. The device wafer includes a first front surface having a plurality of first chips integrated therein and a first back surface opposing the first front surface. The adhesive layer is formed on the first front surface of the device wafer and the adhesive layer includes a plurality of through-holes exposing the first front surface. The plurality of second chips are bonded to the device wafer, and the plurality of second chips are bonded with the adhesive layer to cover the plurality of first through-holes in a one-to-one correspondence.

5 Claims, 10 Drawing Sheets

Related U.S. Application Data continuation of application No. PCT/CN2018/101763, filed on Aug. 22, 2018.

(51) Int. Cl.
    *H01L 23/00*     (2006.01)
    *H01L 25/00*     (2006.01)
    *H01L 25/065*     (2006.01)
    *H01L 23/48*     (2006.01)

(52) U.S. Cl.
    CPC ...... *H01L 21/76898* (2013.01); *H01L 23/481* (2013.01); *H01L 25/0652* (2013.01); *H01L 25/50* (2013.01); *H01L 2225/06544* (2013.01); *H01L 2225/06582* (2013.01)

(58) Field of Classification Search
    CPC ........... H01L 25/50; H01L 2225/06544; H01L 2225/06582; H01L 23/481; H01L 21/187
    See application file for complete search history.

(56) References Cited

FOREIGN PATENT DOCUMENTS

| | | |
|---|---|---|
| CN | 202394963 U | 8/2012 |
| CN | 104600058 A | 5/2015 |
| CN | 105140213 A | 12/2015 |
| CN | 105977222 A | 9/2016 |
| JP | 2011243596 A | 12/2011 |
| JP | 2012509586 A | 4/2012 |
| JP | 2012204810 A | 10/2012 |

* cited by examiner

PACKAGE STRUCTURE OF WAFER-LEVEL SYSTEM-IN-PACKAGE

CROSS-REFERENCE TO RELATED APPLICATIONS

This application is a divisional of U.S. patent application Ser. No. 16/206,037, filed on Nov. 30, 2018, which is a continuation application of PCT Patent Application No. PCT/CN2018/101763, filed on Aug. 22, 2018, which claims priority to Chinese patent application No. 201810416799.0, filed on May 3, 2018, the entirety of which is incorporated herein by reference.

FIELD OF THE DISCLOSURE

The present disclosure generally relates to the field of semiconductor manufacturing and, more particularly, relates to a package structure of wafer-level system-in-package (WLSiP).

BACKGROUND

With the development trend of ultra-large scale integrated circuits, feature size of integrated circuits continues to decrease, and the requirements for packaging technology of integrated circuits are correspondingly increasing. Existing packaging technologies include ball grid array (BGA), chip scale package (CSP), wafer-level package (WLP), 3D package (3D), and system in package (SiP), etc.

The system in package (SiP) can integrate multiple components with different functions, e.g., active components, passive components, micro-electromechanical systems (MEMS), and optical components, etc., into a single unit to form a system or subsystem that provides multiple functions and allows heterogeneous IC integration. Compared to system on chip (SoC), the system in package integration is featured with advantages such as substantially simple, substantially short design cycle and time-to-market cycle, and substantially low cost, enabling to implement substantially complex systems.

At present, to meet the goal of low cost, reliability, fast and high density of integrated circuit package, advanced packaging method mainly uses a wafer-level system-in-package (WLSiP). Compared to existing system in package, the wafer-level system-in-package completes the package integration process on the device wafer, is featured with advantages such as greatly reduced area of the package structure, reduced manufacturing cost, optimized electrical performance, and batch manufacturing, and can significantly reduce the workload and equipment demands.

However, the existing wafer-level system-in-package often results in degraded performance and reliability of the package structure. The disclosed methods and structures are directed to solve one or more problems set forth above and other problems in the art.

BRIEF SUMMARY OF THE DISCLOSURE

One aspect of the present disclosure includes a wafer-level system-in-package (WLSiP) packaging method. The method includes providing a device wafer and a plurality of second chips. The device wafer includes a first front surface having a plurality of first chips integrated therein and a first back surface opposing the first front surface. The method also includes forming an adhesive layer capable of photo-lithography on the first front surface of the device wafer, and patterning the adhesive layer to form a plurality of first through-holes in the adhesive layer, exposing the first front surface. In addition, the method includes after patterning the adhesive layer, bonding the plurality of second chips with a remaining adhesive layer to cover the plurality of first through-holes in a one-to-one correspondence. Moreover, the method includes forming a plurality of second through-holes passing through the device wafer by etching the first back surface of the device wafer. The plurality of second through-holes are connected with the plurality of first through-holes to form a plurality of first conductive through-holes, each first conductive through-hole includes a second through-hole and a first through-hole. Further, the method includes forming a first conductive plug in a first conductive through-hole to electrically connect to one of the plurality of second chips.

Another aspect of the present disclosure includes a wafer-level system-in-package (WLSiP) package structure. The package structure includes a device wafer. The device wafer includes a first front surface having a plurality of first chips integrated therein and a first back surface opposing the first front surface. The device wafer also includes an adhesive layer formed on the first front surface of the device wafer. The adhesive layer includes a plurality of through-holes exposing the first front surface. Further, the method includes a plurality of second chips bonded to the device wafer. The plurality of second chips are bonded with the adhesive layer to cover the plurality of first through-holes in a one-to-one correspondence.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
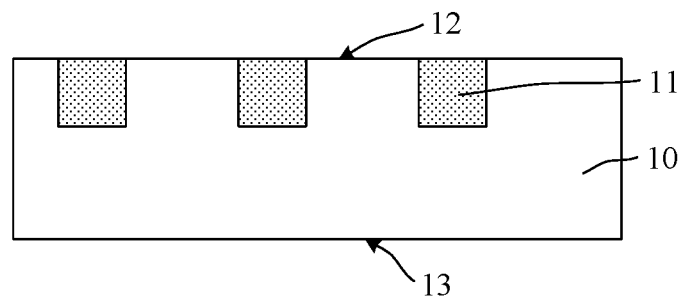
FIGS. 1-4 illustrate schematic diagrams of semiconductor structures corresponding to certain stages of a packaging method.

FIGS. 1-4 illustrate schematic diagrams of semiconductor structures corresponding to certain stages of a packaging method. Referring to FIG. 1, a first device wafer 10 is provided. The first device wafer 10 includes a first front surface 12 having a plurality of first chips 11 integrated therein and a first back surface 13 opposing the first front surface 12.

The first device wafer 10 is used as a wafer to be integrated in a packaging process. After the packaging process is completed, the first device wafer 10 is cut to obtain individual finished chips after performing a package test.

Figure 2:
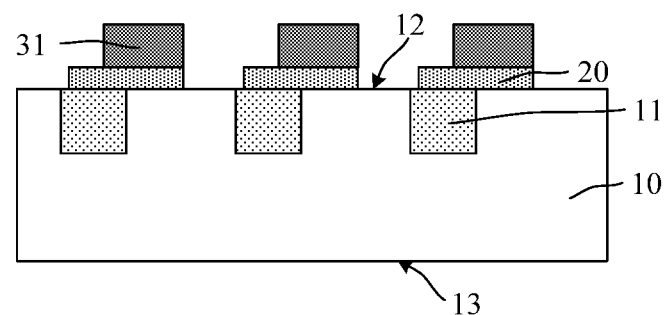

Referring to FIG. 2, a plurality of second chips 31 are provided. The second chip 31 includes a second front surface (not labeled) having semiconductor devices formed thereon and a second back surface (not labeled) opposing the second front surface. An adhesive layer 20 is formed on one of the second front surface and the second back surface.

The second chip 31 is used as a chip to be integrated in the packaging process. A wafer-level system-in-package (WLSiP) is realized by integrating the plurality of second chips 31 having different functions into one package structure.

At present, providing the second chips 31 includes: providing a plurality of second device wafers having different functions, where each second device wafer includes a third front surface having the plurality of second chips 31 integrated therein and a third back surface opposing the third front surface; forming an adhesive film on one of the third front surface and the third back surface; and cutting the plurality of second device wafers and the adhesive film on the second device wafer to obtain the plurality of second chips 31 having different functions and the adhesive layer 20 on one of the second front surface and the second back surface of the second chip 31.

Referring to FIG. 2, the adhesive layer 20 is fixed to the first front surface 12. The first device wafer 10 and the second chip 31 are adhesively bonded through the adhesive layer 20.

Figure 3:
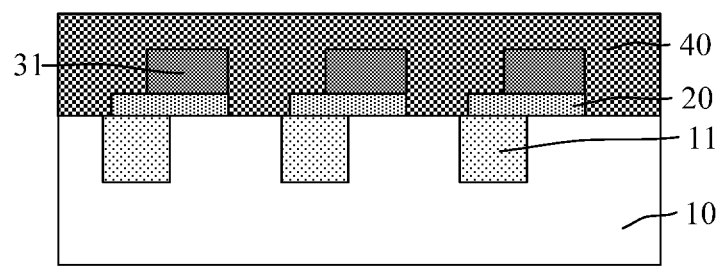

Referring to FIG. 3, an encapsulation layer 40 is formed on the first front surface 12 (illustrated in FIG. 2) to cover the second chips 31. After forming the encapsulation layer 40, a thinning process is performed on the first device wafer 10 through the first back surface 13 (illustrated in FIG. 2).

Figure 4:
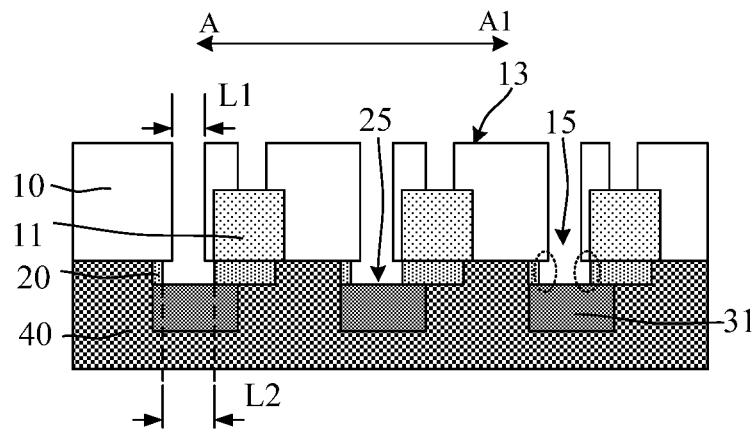

Referring to FIG. 4, the first back surface 13 and the adhesive layer 20 are successively etched by a through-silicon via (TSV) etching process, to form a first through-hole 15 in the first device wafer 10 and a second through-hole 25 in the adhesive layer 20. The second through-hole 25 penetrates the first through-hole 15 and exposes the second chip 31. The second through-hole 25 and the first through-hole 15 form a conductive through-hole. An extension direction of the conductive through-hole is a first direction, and a direction perpendicular to the first direction and a normal direction of the first front surface 12 (illustrated in FIG. 2) is a second direction (illustrated as "AA1" in FIG. 4).

The wafer-level system-in-package (WLSiP) mainly includes two processes: physical connection and electrical connection. The adhesive layer 20 is often made of an organic material and is used to realize physical connection between the second chip 31 and the first device wafer 10. The through-silicon via etching technique and an electroplating technique are used to realize electrical connection between the first chip 11 as well as the second chip 31 and other circuits, and electrical connection between the first chip 11 and the second chip 31.

The process of the through-silicon via etching is often a reactive ion dry etching process. After forming the first through-hole 15 by etching, an opening size L2 (illustrated in FIG. 4) and the morphology of the second through-hole 25 are mainly determined according to the morphology of the first through-hole 15 and the etching process.

Further, during the dry etching process, by-products which do not react with the etching gas are generated from polymer, and the by-products are easily attached to the sidewall of the opening to prevent lateral etching (i.e., the etching along the second direction). The adhesive layer 20 is made of an organic material, the etching gas is mainly $O_2$, and the by-products generated in the dry etching process are mostly gases. Therefore, when etching the adhesive layer 20, the sidewall of the second through-hole 25 cannot be effectively protected, and, thus, the lateral etching is serious. Accordingly, after forming the second through-hole 25, the opening size L2 of the second through-hole 25 tends to become substantially large. In other words, an opening size L1 (illustrated in FIG. 4) of the first through-hole 15 is smaller than the opening size L2 of the second through-hole 25. The opening size L1 of the first through-hole 15 refers to a size of the first through-hole 15 along the second direction, and the opening size L2 of the second through-hole 25 refers to a size of the second through-hole 25 along the second direction. Moreover, when a thickness of the adhesive layer 20 is substantially large, the issue of the opening size L2 of the second through-hole 25 being substantially large becomes more obvious.

To realize the electrical connection between the semiconductor devices, a conductive plug is further formed in the conductive through-hole by an electroplating technique. Because the opening size L1 of the first through-hole 15 is smaller than the opening size L2 of the second through-hole 25, a gap (illustrated by dashed circle in FIG. 4) is easily formed between the first device wafer 10 and the second chip 31 at a location close to the sidewall of the second through-hole 25. Correspondingly, the material of the conductive plug cannot effectively fill the gap, and the conductive plug cannot even be formed in the gap. Therefore, the electrical connection performance of the conductive plug is reduced, leading to degraded performance and reliability of the package structure.

The present disclosure provides a wafer-level system-in-package (WLSiP) packaging method and WLSiP package structure with improved performance and reliability. In the present disclosure, before bonding a device wafer to a second chip, an adhesive layer may be formed on a first front surface of the device wafer, and a patterning process may be performed on the adhesive layer to form a plurality of first through-holes exposing the first front surface in the adhesive layer. The first through-hole may be in one-to-one correspondence with the second chip. Compared to the method of sequentially etching the first back surface of the device wafer and the adhesive layer to successively form the first through-hole in the device wafer and the second through-hole penetrating through the first through-hole in the adhesive layer, in the present disclosure, the first through-hole may be first formed, and then a second through-hole may be formed by etching a first back surface of the device wafer, such that the serious lateral etching issue of the adhesive layer may be prevented, and accordingly, the issue of the opening size of the first through-hole being larger than the opening size of the second through-hole may be prevented. Correspondingly, when subsequently forming a first conductive plug electrically connected to the second chip in a first conductive through-hole, the formation difficulty of the first conductive plug in the first through-hole may be reduced, and the formation quality of the first conductive plug in the first through-hole may be improved, thereby improving the electrical connection performance of the first conductive plug, and further optimizing the performance and reliability of the package structure.

Figure 20:
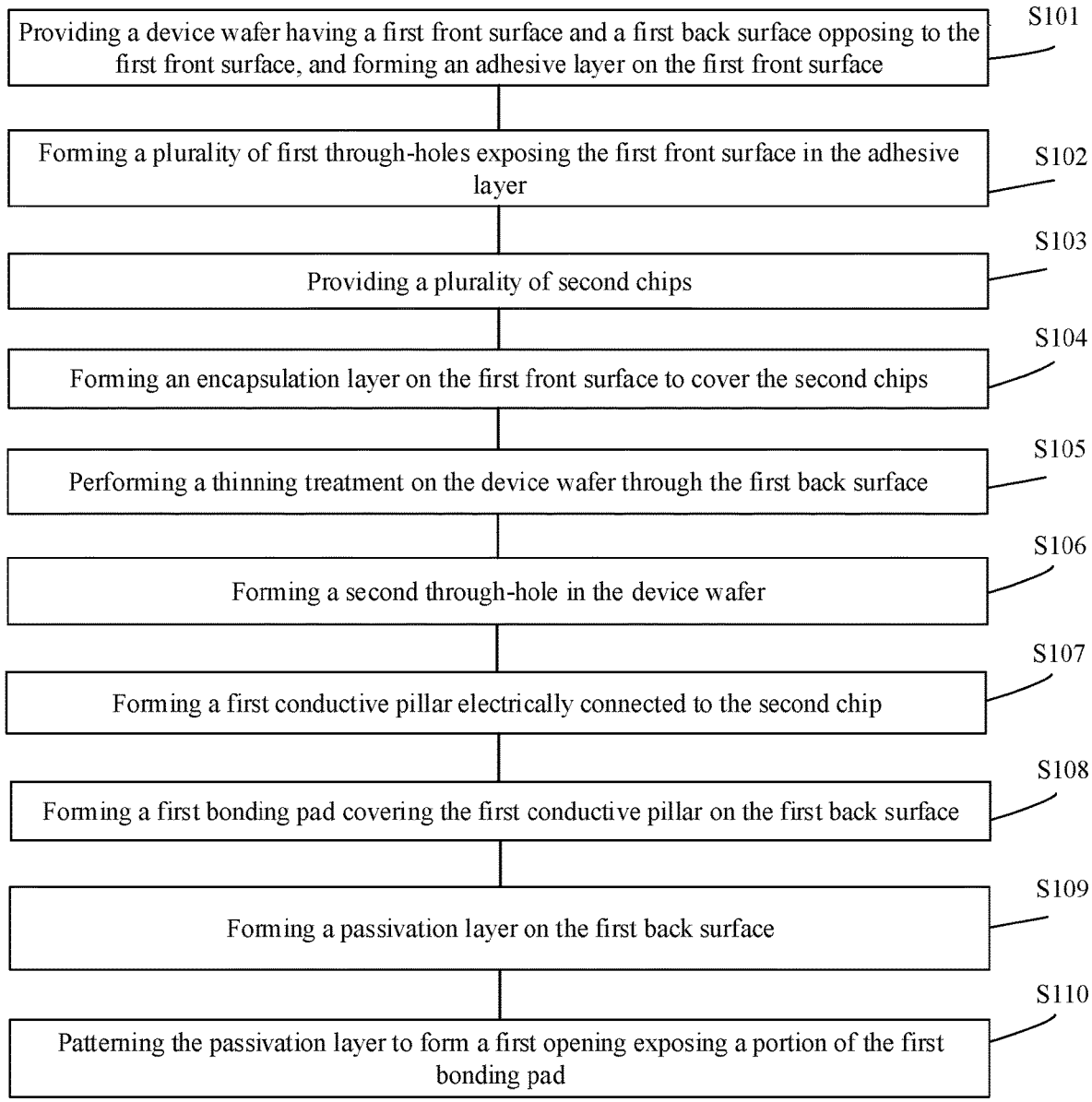
FIG. 20 illustrates a flowchart of an exemplary WLSiP packaging method consistent with various disclosed embodiments of the present disclosure.

FIG. 20 illustrates a flowchart of an exemplary WLSiP packaging method consistent with various disclosed embodiments of the present disclosure; and FIGS. 5-14 illustrate schematic diagrams of semiconductor structures corresponding to certain stages of the exemplary WLSiP packaging method.

Figure 5:
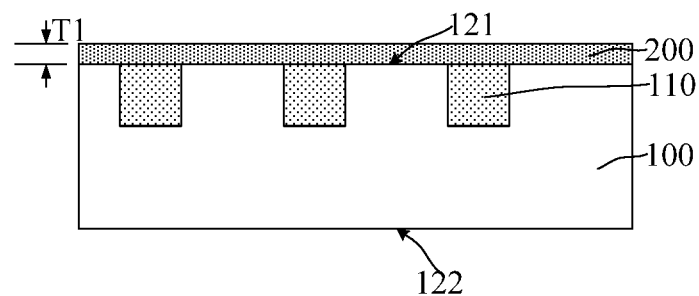
FIGS. 5-14 illustrate schematic diagrams of semiconductor structures corresponding to certain stages of an exemplary wafer-level system-in-package (WLSiP) packaging method consistent with various disclosed embodiments of the present disclosure.

As shown in FIG. 20, at the beginning of the WLSiP packaging method, a device wafer with certain structures may be provided and an adhesive layer may be formed on the device wafer (S101). FIG. 5 illustrates a schematic diagram of a corresponding semiconductor structure.

Referring to FIG. 5, a device wafer (CMOS Wafer) 100 may be provided. The device wafer 100 may include a first front surface 121 having a plurality of first chips 110 integrated therein and a first back surface 122 opposing the first front surface 121. The device wafer 100 may be a wafer for completing a device fabrication, and the device wafer 100 may be used as a wafer to be integrated in a packaging process.

In one embodiment, the device wafer 100 may be adaptable to implementing a WLSiP. The WLSiP may refer to a technique of integrating a plurality of components with different functions, e.g., active components, passive components, micro-electromechanical systems, and optical components, etc., into one device wafer, and cutting the one device wafer to obtain individual packaged products. The WLSiP may be featured with advantages such as high efficiency, high density, small size, high yield and desired electrothermal performance, therefore, the ever-increasing packaging process requirements may be satisfied.

In certain embodiments, the device wafer may be adaptable to implementing a wafer-level packaging process. The wafer-level packaging may refer to a technique of directly performing most or all of the packaging test procedures on the device wafer, and then cutting the device wafer to obtain individual finished chips.

Referring to FIG. 5, an adhesive layer 200 capable of photolithography may be formed on the first front surface 121 of the device wafer 100. The adhesive layer 200 may be made of an adhesive material. After subsequently performing a patterning process on the adhesive layer 200, the remaining adhesive layer 200 may be adaptable to achieving the adhesive bonding of the device wafer 100 to the chip to be integrated.

In one embodiment, the adhesive layer 200 may be made of an adhesive material capable of photolithography. Therefore, the adhesive layer 200 may be patterned by exposure and development processes. Accordingly, the use of an additional etching process may be avoided and the process steps of subsequently patterning the adhesive layer 200 may be simplified, which may facilitate to reduce the process cost and to improve the packaging efficiency. Moreover, patterning the adhesive layer 200 by the exposure and development processes may not affect the viscosity of adhesive layer 200.

In one embodiment, the material of the adhesive layer 200 may be a dry film. The dry film may be an adhesive photoresist film used in package of semiconductor chips or the manufacture of a printed circuit board. The dry film photoresist is manufactured by coating a solvent-less photoresist on polyester, and covering a polyethylene film on the photoresist. When using the dry film, the polyethylene film may be first removed, and then the solvent-less photoresist may be pressed onto a base substrate. After performing the exposure and development processes, a pattern may be formed in the dry film photoresist. In certain embodiments, the adhesive layer may be made of polyimide, polybenzoxazole (PBO), or benzocyclobutene (BCB), etc.

A thickness T1 of the adhesive layer 200 cannot be too small or too large. If the thickness T1 of the adhesive layer 200 is too small, the adhesive layer 200 may be insufficient to achieve the adhesive bonding of the device wafer 100 to the chip to be integrated. If the thickness T1 of the adhesive layer 200 is too large, the difficulty of a subsequent patterning process may increase accordingly, and the process resources and time may be wasted. Therefore, in one embodiment, the thickness T1 of the adhesive layer 200 may be in a range of approximately 5 μm-100 μm according to actual process requirements.

Figure 6:
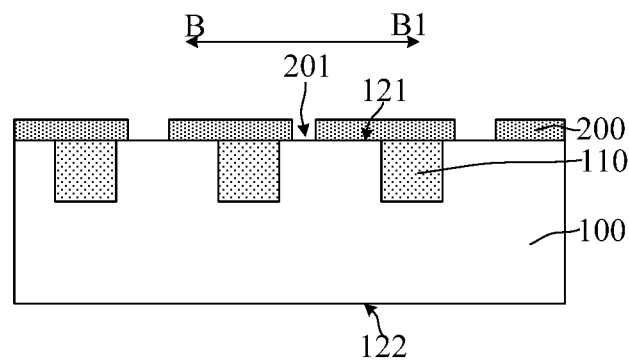

Returning to FIG. 20, after forming the adhesive layer, a plurality of first through-holes may be formed (S102). FIG. 6 illustrates a schematic diagram of a corresponding semiconductor structure.

Referring to FIG. 6, the adhesive layer 200 may be patterned to form a plurality of first through-holes 201 exposing the first front surface 121 in the adhesive layer 200. To achieve the adhesive bonding of the device wafer 100 to the chip to be integrated, the chip to be integrated may be subsequently disposed on the remaining adhesive layer 200. The first through-hole 201 may be used to provide a spatial location for subsequently forming a conductive plug electrically connected to the chip to be integrated. Correspondingly, after subsequently disposing the chips to be integrated on the remaining adhesive layer 200, the plurality of first through-holes 201 may be in one-to-one correspondence with the chips to be integrated.

In one embodiment, a projection of the first through-hole 201 onto the first front surface 121 may be located on a side of the first chip 110, to avoid bridge connection between the conductive plug electrically connected to the chip to be integrated and the first chip 110. To achieve the normal use function of the package structure, according to the actual process requirements, the first through-holes 201 may be in one-to-one correspondence with the first chips 110. The one-to-one correspondence between the first through-holes 201 and the first chips 110 may refer to that a quantity of the first through-holes 201 is equal to a quantity of the first chips 110, and the first through-hole 201 and the first chip 110 have a preset relative positional relationship.

In one embodiment, an extension direction of the first through-hole 201 may be a first direction, and a direction perpendicular to the first direction and a normal direction of the first front surface 121 may be a second direction (illustrated as BB1 in FIG. 6).

In one embodiment, the material of the adhesive layer 200 may be a dry film. Correspondingly, patterning the adhesive layer 200 may include performing the exposure and development processes on the adhesive layer 200. Patterning the adhesive layer 200 by the exposure and development processes may facilitate to improve the accuracy of an opening size of the first through-hole 201 along the second direction. Moreover, after performing the exposure and development processes, the remaining adhesive layer 200 may still be adhesive to achieve the adhesive bonding of the device wafer 100 to the chip to be integrated.

In one embodiment, to reduce the process difficulty and process cost of patterning the adhesive layer 200, after patterning the adhesive layer 200, the remaining adhesive layer 200 may expose the first front surface 121 at a location corresponding to the first through-hole 201.

Figure 7:
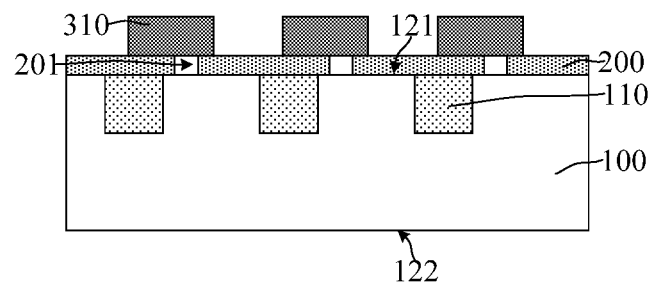

Returning to FIG. 20, after forming the plurality of first through-holes, a plurality of second chips may be provided (S103). FIG. 7 illustrates a schematic diagram of a corresponding semiconductor structure.

Referring to FIG. 7, a plurality of second chips 310 may be provided. The second chip 310 may be used as the chip to be integrated in a WLSiP packaging process. The plurality of second chips 310 may have at least one type of function.

In one embodiment, the plurality of second chips 310 may have multiple types of functions, and a quantity of the second chips 310 may be equal to the quantity of the first chips 110. The WLSiP scheme may be realized by integrating the plurality of second chips 310 with different functions into one package structure. In certain embodiments, when the device wafer is adaptable to implementing a wafer-level packaging process, the plurality of second chips may have a same type of function.

The second chips 310 may be fabricated using integrated circuit fabrication techniques. In one embodiment, the second chip 310 may be a memory chip, a communication chip, a processor, or a logic chip, etc. In certain embodiments, the second chip may be any other suitable functional chip.

In one embodiment, the first through-hole 201 may be used to provide a spatial location for subsequently forming a conductive plug electrically connected to the second chip 310. Correspondingly, the second chips 310 may be in one-to-one correspondence with the first through-holes 201. The one-to-one correspondence between the second chips 310 and the first through-holes 201 may refer to that the quantity of the first through-holes 201 is equal to the quantity of the second chips 310, and the first through-hole 201 exposes a partial first front surface 121 (illustrated in FIG. 6) at a location corresponding to the second chip 310.

Referring to FIG. 7, after disposing the second chip 310 on the patterned remaining adhesive layer 200, the second chips 310 may be in one-to-one correspondence with the first through-holes 201, and may cover the tops of the first through-holes 201. The remaining adhesive layer 200 may realize the bonding of the device wafer 100 to the second chip 310.

In one embodiment, the adhesive layer 200 may be made of an adhesive material. Therefore, the adhesive bonding of the device wafer 100 to the second chip 310 may be realized by disposing the second chip 310 on the remaining adhesive layer 200. In other words, the bonding of the device wafer 100 to the second chip 310 may be achieved by adhesion.

The plurality of second chips 310 may have different functions. The plurality of second chips 310 may be obtained by cutting a plurality of device wafers with different functions. The second chip 310 may often include an NMOS device, a PMOS device, or any other suitable semiconductor device formed on a semiconductor substrate, and may further include a dielectric layer, a metal interconnection structure, and a bonding pad, etc.

In one embodiment, the second chip 310 may include a second front surface (not labeled) having devices and a second back surface (not labeled) opposing the second front surface. Further, the second back surface may refer to a bottom surface of the semiconductor substrate on a side away from the bonding pad.

Accordingly, when disposing the second chip 310 on the remaining adhesive layer 200, according to actual process requirements, one of the second front surface and the second back surface of the second chip 310 may be disposed on the adhesive layer 200.

The second chip 310 may cover the top of the first through-hole 201. In other words, a projection of the first through-hole 201 onto the second chip 310 may be located within the second chip 310, which may provide a process basis for subsequently forming a conductive plug electrically connected to the second chip 310, and may improve the electrical connection performance of the conductive plug.

Figure 8:
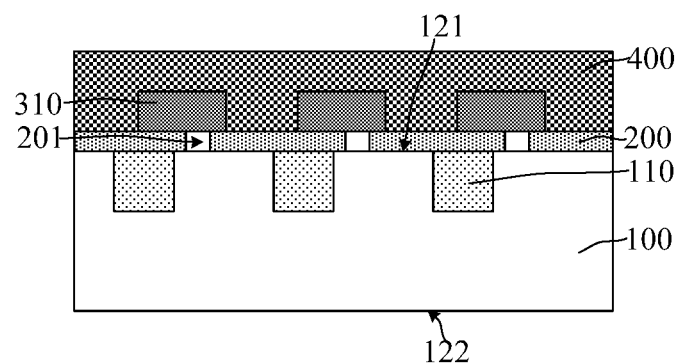

Returning to FIG. 20, after providing the second chip, an encapsulation layer may be formed (S104). FIG. 8 illustrates a schematic diagram of a corresponding semiconductor structure.

Referring to FIG. 8, after bonding the device wafer 100 to the second chip 310, an encapsulation layer 400 may be formed on the first front surface 121 to cover the second chip 310. The encapsulation layer 400 may cover the second chip 310 to function as a seal and moisture proof, and, thus, may protect the second chip 310. Therefore, the probability that the second chip 310 is damaged, contaminated or oxidized may be reduced, which may facilitate to optimize the performance and reliability of the package structure formed after being packaged.

In one embodiment, the encapsulation layer 400 may be made of epoxy resin (Epoxy). Epoxy resin is featured with advantages such as low shrinkage, desired adhesion, desired corrosion resistance, desired electrical performance and low cost, etc., and, thus, is widely used as a packaging material for electronic devices and integrated circuits. In certain embodiments, the encapsulation layer may be made of a photoresist, a prepreg or a laser activated material, etc.

In one embodiment, the encapsulation layer 400 may be formed by an injection molding process using a liquid molding compound or a solid molding compound. The injection molding process may have desired filling performance to enable the molding compound to sufficiently fill gaps between the plurality of second chips 310, thereby improving the packaging performance of the encapsulation layer 400. In one embodiment, the injection molding process may be a hot press injection molding process. In certain embodiments, the encapsulation layer may be formed by other processes.

Figure 9:
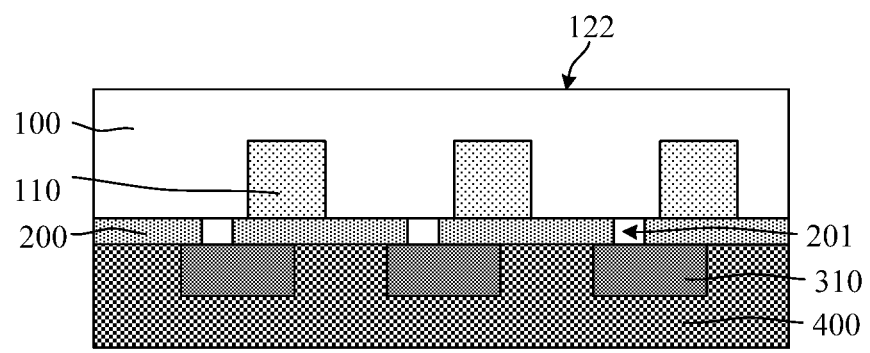

Returning to FIG. 20, after forming encapsulation layer, a thinning treatment may be performed on the device wafer (S105). FIG. 9 illustrates a schematic diagram of a corresponding semiconductor structure.

Referring to FIG. 9, after forming the encapsulation layer 400, a thinning treatment may be performed on the device wafer 100 through the first back surface 122. The thickness of the device wafer 100 may be reduced by performing the thinning treatment on the device wafer 100, which may improve the heat dissipation performance of the device wafer 100, and may facilitate to perform subsequent packaging processes and to reduce an overall thickness of the package structure obtained after being packaged.

In one embodiment, the process used in the thinning treatment may be one or more of a back grinding process, a chemical mechanical polishing (CMP) process, and a wet etching process.

In one embodiment, the thinning treatment may be performed after forming the encapsulation layer 400, such that the encapsulation layer 400 may fix and support the second chip 310 during the thinning treatment.

In certain embodiments, the encapsulation layer may be formed after performing the thinning treatment. For example, after disposing the second chip on the adhesive layer and before performing the thinning treatment, the surface of the second chip opposing the adhesive layer may be temporarily bonded to a carrier wafer. The carrier wafer may temporarily fix and support the plurality of second chips during the thinning treatment, and may reduce the probability that the second chips fall off. The temporary bonding may also facilitate to subsequently separate the second chips and the carrier wafer.

Correspondingly, after performing the thinning treatment, a de-bonding process may be performed on the second chips and the carrier wafer to remove the carrier wafer. After performing the de-bonding process, the encapsulation layer may be formed on the first front surface to cover the second chips.

Figure 10:
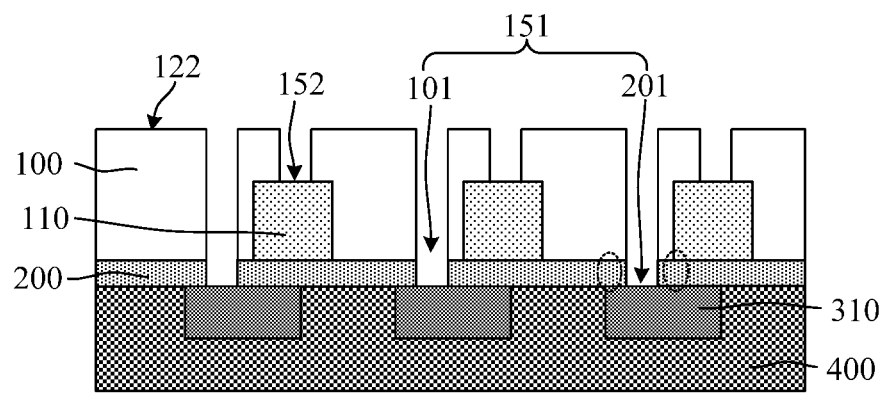

Returning to FIG. 20, after forming the encapsulation layer, a second through-hole may be formed (S106). FIG. 10 illustrates a schematic diagram of a corresponding semiconductor structure.

Referring to FIG. 10, after forming the encapsulation layer 400 and performing the thinning treatment, the first back surface 122 of the device wafer 100 may be etched to form a second through-hole 101 in the device wafer 100. The second through-hole 101 may penetrate through the device wafer 100 and penetrate the first through-hole 201. The second through-hole 101 and the first through-hole 201 may form a first conductive through-hole 151. The first conductive through-hole 151 may be used to provide a spatial location for subsequently forming a first conductive plug electrically connected to the second chip 310.

In one embodiment, the second through-hole 101 may be formed by a through-silicon via (TSV) etching process. The etching process may be one or more of a dry etching process and a wet etching process.

In one embodiment, etching the device wafer 100 may include: etching a portion of the thickness of the device wafer 100 by a dry etching process; after performing the dry etching process, etching the remaining thickness of the device wafer 100 by a wet etching process to form the second through-hole 101 penetrating through the device wafer 100.

The method of performing the wet etching process after performing the dry etching process may prevent the adhesive layer 200 and the second chip 310 from etching loss while improving the etching efficiency, and may facilitate to reduce the influence on the opening size of the first through-hole 201 along the second direction (illustrated as BB1 in FIG. 6).

In one embodiment, the adhesive layer 200 may be first patterned to form the first through-hole 201, and then the device wafer 100 may be etched to form the second through-hole 101. In other words, before etching the device wafer 100, the first through-hole 201 may already be formed in the adhesive layer 200. The opening size of the first through-hole 201 along the second direction may be determined by the patterning process of the adhesive layer 200, such that the opening size of the first through-hole 201 along the second direction may meet the process requirements. Therefore, compared to the method of sequentially etching the device wafer and the adhesive layer to successively form the first through-hole in the device wafer and the second through-hole penetrating the first through-hole in the adhesive layer, in the present disclosure, the issue of the opening size of the first through-hole 201 along the second direction being larger than the opening size of the second through-hole 101 along the second direction may be prevented, and the issue of forming a gap between the device wafer 100 and the second chip 310 at a location (illustrated as dotted circle in FIG. 10) close to the sidewall of the first through-hole 201 may be prevented.

Because the plurality of second chips 310 may have different functions, the method of forming the second through-hole 101 after forming the first through-hole 201 may realize the wafer-level system-in-package while optimizing the performance and reliability of the package structure. By combining the WLSiP packaging method and the existing system in package method, integration of multiple chips, the packaging process on the device wafer, and other manufacturing advantages may be realized.

In one embodiment, the WLSiP packaging method may further include etching the first back surface 122 of the device wafer 100 to form a second conductive through-hole 152 exposing the first chip 110 in the device wafer 100. The second conductive through-hole 152 may be used to provide a spatial location for subsequently forming a second conductive plug electrically connected to the first chip 110.

In one embodiment, the second through-hole 101 and the second conductive through-hole 152 may be respectively formed in the device wafer 100 by different etching processes. In the present disclosure, the second through-hole 101 is formed after forming the second conductive through-hole 152 as an example.

In one embodiment, the first back surface 122 above the first chip 110 may be etched to form the second conductive through-hole 152 exposing the first chip in the device wafer 100. A filling layer (not illustrated) may be formed in the second conductive through-hole 152, and the filling layer may further cover the first back surface 122. A pattern layer (not illustrated) may be formed on the filling layer, and the pattern layer may have a pattern opening (not illustrated) exposing the filling layer above the first through-hole 201. The filling layer and the device wafer 100 may be sequentially etched along the pattern opening using the pattern layer as a mask to form the second through-hole 101 penetrating through the device wafer 100 and penetrating the first through-hole 201 in the device wafer 100. After forming the second through-hole 101, the pattern layer and the filling layer may be removed.

The second conductive through-hole 152 may have a small depth. The method of forming the second through-hole 101 after forming the conductive through-hole 152 may reduce the process difficulty of removing the filling layer in the second conductive through-hole 152. In certain embodiments, the second conductive through-hole may be formed after forming the second through-hole.

Figure 11:
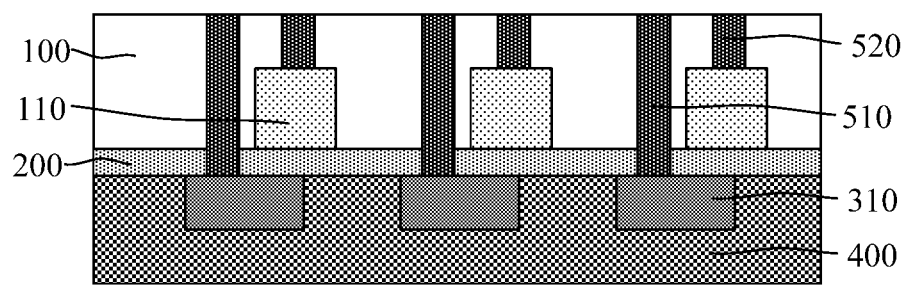

Returning to FIG. 20, after forming the second through-hole, a first conductive plug may be formed (S107). FIG. 11 illustrates a schematic diagram of a corresponding semiconductor structure.

Referring to FIG. 11, a first conductive plug 510 electrically connected to the second chip 310 may be formed in the first conductive through-hole 151 (illustrated in FIG. 10). The first conductive plug 510 may be used to implement electrical connection between the second chip 310 and other circuits.

When forming the first conductive plug 510, a second conductive plug 520 electrically connected to the first chip 110 may be formed in the second conductive through-hole 152 (illustrated in FIG. 10). The second conductive plug 520 may be electrically connected to the first chip 110 for implementing electrical connection between the first chip 110 and other circuits. Moreover, the electrical connection between the second chip 310 and the first chip 110 may be achieved through the first conductive plug 510 and the second conductive plug 520.

In one embodiment, the first conductive plug 510 and the second conductive plug 520 each may be made of copper. In certain embodiments, the first conductive plug and the second conductive plug each may be made of aluminum, tungsten, titanium, and any other suitable conductive material.

In one embodiment, an electroplating process may be used to fill the first conductive through-hole 151 and the second conductive through-hole 152 with a conductive material layer. The conductive material layer may further cover the first back surface 122 (illustrated in FIG. 10) of the device wafer 100. A planarization process may be performed on the conductive material layer to remove the conductive material layer on the first back surface 122. The conductive material in the first conductive through-hole 151 may be retained as the first conductive plug 510, and the conductive material in the second conductive through-hole 152 may be retained as the second conductive plug 520.

Because the second through-hole 101 (illustrated in FIG. 10) may be formed after forming the first through-hole 201 (illustrated in FIG. 10), the probability of forming the gap between the device wafer 100 and the second chip 310 at a location (as illustrated by dashed circle in FIG. 10) close to the sidewall of the first through-hole 201 may be substantially low. Accordingly, the filling performance and quality of the conductive material in the first through-hole 201 may be desired, which may facilitate to improve the electrical connection performance of the first conductive plug 510, and may further optimize the performance and reliability of the package structure.

Figure 12:
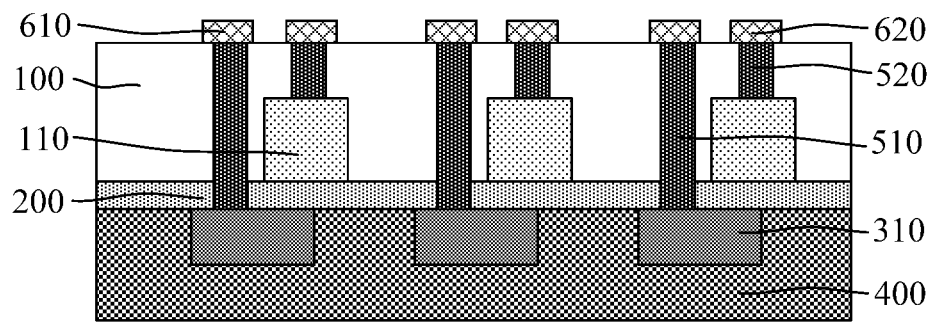

Returning to FIG. 20, after forming the first conductive plug, a first bonding pad may be formed (S108). FIG. 12 illustrates a schematic diagram of a corresponding semiconductor structure.

Referring to FIG. 12, after forming the first conductive plug 510 and the second conductive plug 520, a first bonding pad 610 covering the first conductive plug 510 and a second bonding pad 620 covering the second conductive plug 520 may be formed on the first back surface 122 (illustrated in FIG. 10) of the device wafer 100.

The second chip 310 may be electrically connected to other circuits through the first conductive plug 510 and the first bonding pad 610. The first chip 110 may be electrically connected to other circuits through the second conductive plug 520 and the second bonding pad 620.

In one embodiment, the first bonding pad 610 and the second bonding pad 620 each may be made of aluminum. In certain embodiments, the first bonding pad and the second bonding pad each may be made of copper, or any other suitable conductive material.

Figure 13:
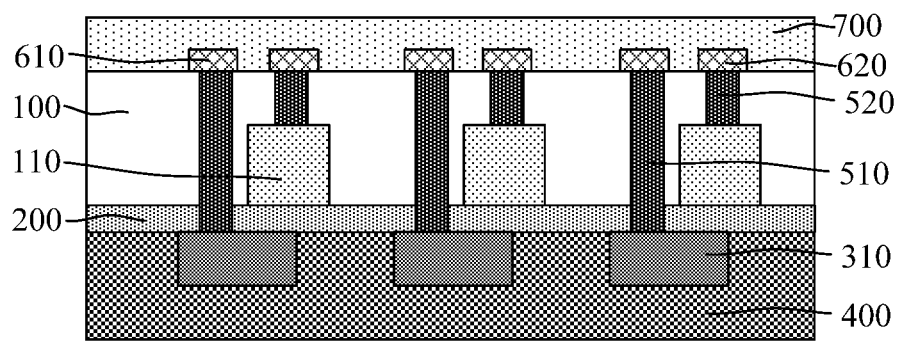

Returning to FIG. 20, after forming the first bonding pad, a passivation layer may be formed (S109). FIG. 13 illustrates a schematic diagram of a corresponding semiconductor structure.

Referring to FIG. 13, after forming the first bonding pad 610 and the second bonding pad 620, a passivation layer 700 may be formed on the first back surface 122 (illustrated in FIG. 10). The passivation layer 700 may cover the tops of the first bonding pad 610 and the second bonding pad 620. In one embodiment, the passivation layer 700 may be made of phosphorous silicon glass (PSG), silicon oxide, silicon nitride, silicon oxynitride, or polyimide, etc.

The passivation layer 700 may cover the first back surface 122 and prevent the device from being affected by external impurities (e.g., sodium ions), ion charges, and moisture, etc. Therefore, the performance and stability of the device may be improved, and the performance and reliability of the package structure may be improved.

Figure 14:
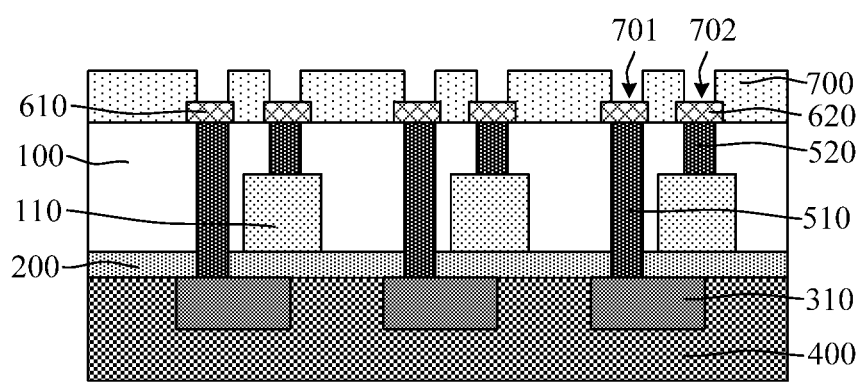

Returning to FIG. 20, after forming the passivation layer, the passivation layer may be patterned (S110). FIG. 14 illustrates a schematic diagram of a corresponding semiconductor structure.

Referring to FIG. 14, the passivation layer 700 may be patterned to expose a portion of each of the first bonding pad 610 and the second bonding pad 620. In one embodiment, the passivation layer 700 may be patterned by an etching process to form a first opening 701 (illustrated in FIG. 14) and a second opening 702 (illustrated in FIG. 14) in the passivation layer 700. The first opening 701 may expose a portion of the first bonding pad 610, and the second opening 702 may expose a portion of the second bonding pad 620. Therefore, the electrical connection between the second chip 310 and other circuits may be implemented through the first bonding pad 610 exposed by the first opening 701, and the electrical connection between the first chip 110 and other circuits may be implemented through the second bonding pad 620 exposed by the second opening 702. Further, the electrical connection between the second chip 310 and the first chip 110 may be achieved through the exposed first bonding pad 610 and second bonding pad 620.

Figure 15:
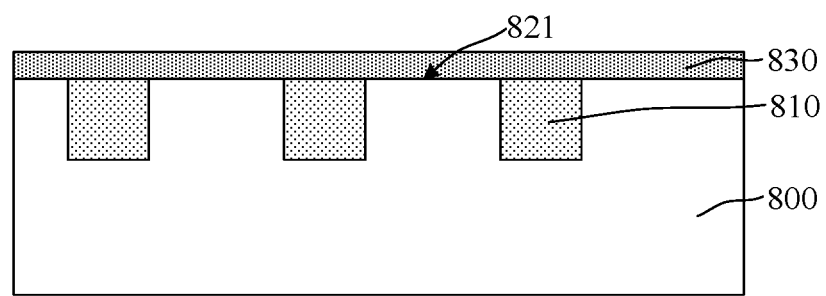
FIGS. 15-17 illustrate schematic diagrams of semiconductor structures corresponding to certain stages of another exemplary WLSiP packaging method consistent with various disclosed embodiments of the present disclosure.
Figure 16:
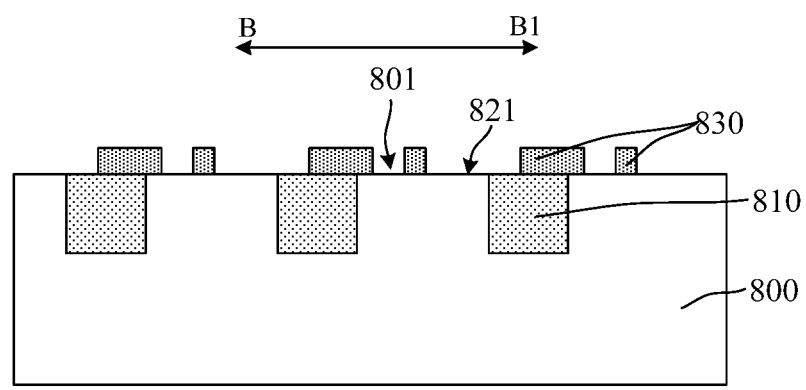
Figure 17:
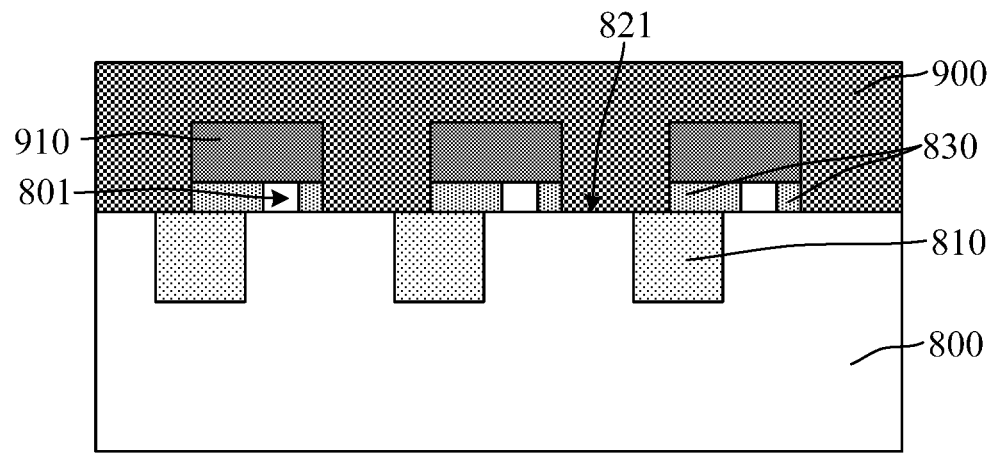
Figure 21:
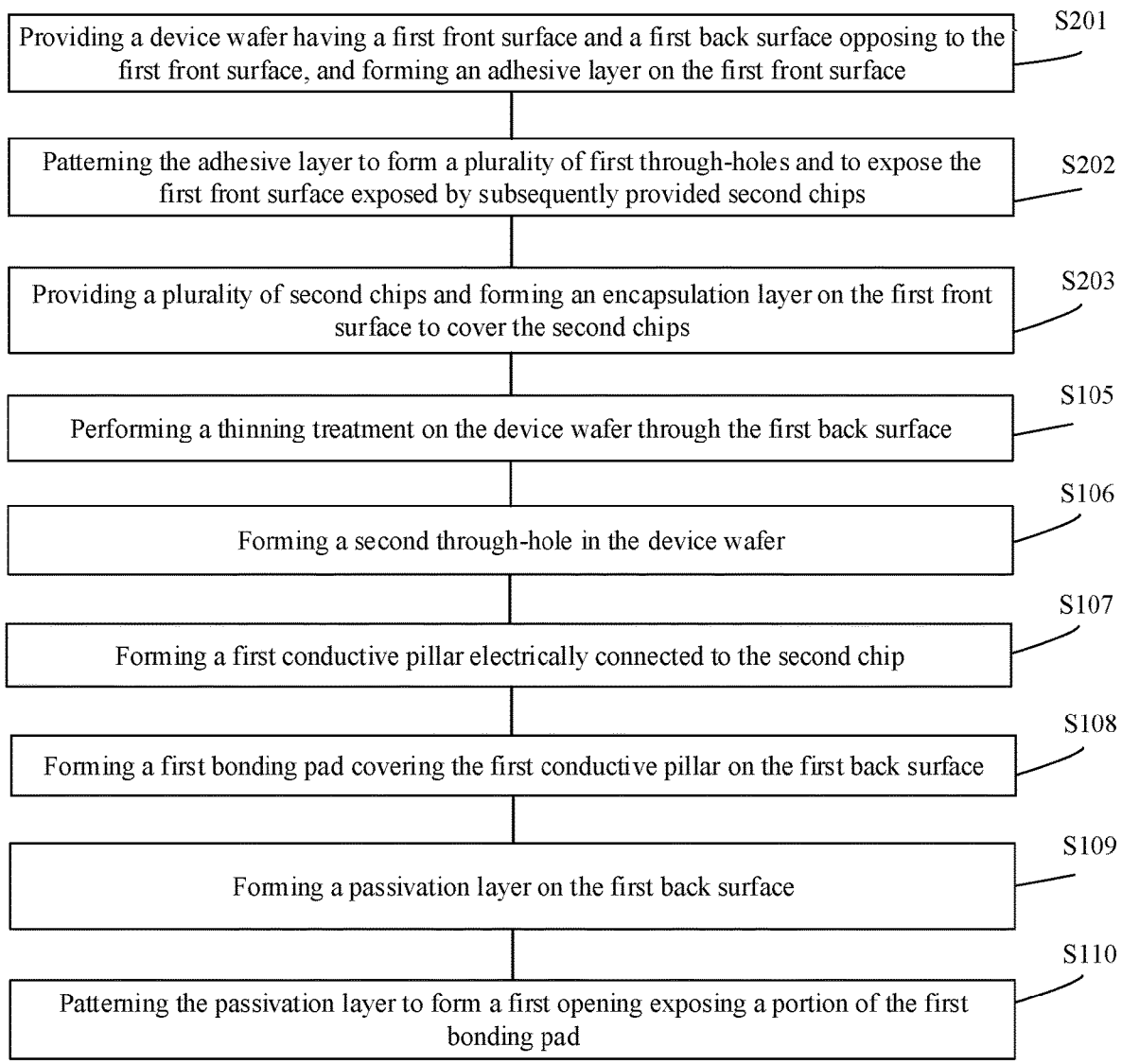
FIG. 21 illustrates a flow chart of another exemplary WLSiP packaging method consistent with various disclosed embodiments of the present disclosure.

FIG. 21 illustrates a flow chart of another exemplary WLSiP packaging method consistent with various disclosed embodiments of the present disclosure; and FIGS. 15-17 illustrate schematic diagrams of semiconductor structures corresponding to certain stages of the exemplary WLSiP packaging method.

The same or similar features of the embodiments in the present disclosure and the embodiments associated with FIGS. 5-14 are not repeated herein, while certain difference may include the following. Referring to FIG. 17, after patterning an adhesive layer 830, the remaining adhesive layer 830 may cover a first front surface 821 at a location corresponding to a second chip 910. A plurality of first through-holes 801 may be formed in the remaining adhesive layer 830, and the first through-hole 801 may be in one-to-one correspondence with the second chip 910.

Correspondingly, after subsequently forming an encapsulation layer 900 covering the second chip 910, the encapsulation layer 900 may cover the first front surface 821 exposed by the second chip 910. Therefore, the encapsulation layer 900 may have a desired contact with the first front surface 821 and may effectively function as insulation, seal, and moisture proof.

As shown in FIG. 21, at the beginning of the WLSiP packaging method, a device wafer with certain structures may be provided and an adhesive layer may be formed on the device wafer (S201). FIG. 15 illustrates a schematic diagram of a corresponding semiconductor structure.

Referring to FIG. 15, a device wafer 800 may be provided. The device wafer 800 may include a first front surface 821 having a plurality of first chips 810 integrated therein. An adhesive layer 830 may be formed on the first front surface 821 of the device wafer 800. The detailed descriptions of the wafer device 800 and the adhesive layer 830 may refer to corresponding descriptions in embodiments associated with FIG. 5, and are omitted herein.

Returning to FIG. 21, after forming the adhesive layer, the adhesive layer may be patterned (S202). FIG. 16 illustrates a schematic diagram of a corresponding semiconductor structure.

Referring to FIG. 16, the adhesive layer 830 may be patterned to form a plurality of first through-holes 801 exposing the first front surface 821 in the adhesive layer 830. After patterning the adhesive layer 830, the remaining adhesive layer 830 may cover the first front surface 821 at a location corresponding to a subsequently formed second chip. Accordingly, the remaining adhesive layer 830 may expose the first front surface 821 exposed by the second chip. The detailed descriptions of the patterning process may refer to corresponding descriptions in embodiments associated with FIG. 6, and are omitted herein.

Returning to FIG. 21, after patterning the adhesive layer, a second chip may be provided and an encapsulation layer may be formed (S203). FIG. 17 illustrates a schematic diagram of a corresponding semiconductor structure.

Referring to FIG. 17, a second chip 910 may be provided. In one embodiment, to realize adhesive bonding of the device wafer 800 to the second chip 910, after patterning the adhesive layer 830, the remaining adhesive layer 830 may cover the first front surface 821 at a location corresponding to the second chip 910. The first through-hole 801 may be in one-to-one correspondence with the second chip 910. The first through-hole 801 may be used to provide a spatial location for subsequently forming a conductive plug electrically connected to the second chip 910.

The one-to-one correspondence between the first through-hole 801 and the second chip 910 may refer to that a quantity of the first through-holes 801 is equal to a quantity of the second chips 910, and the first through-hole 801 exposes a portion of the first front surface 821 at a location corresponding to the second chip 910.

In one embodiment, after patterning the adhesive layer 830, the remaining adhesive layer 830 may cover at least a portion of the first chip 810. Therefore, the spacing between the corresponding first chip 810 and the second chip 910 in a direction parallel to the first front surface 821 may be reduced, which may facilitate to improve process integration degree. In certain embodiments, the remaining adhesive layer may be on the first front surface on a side of the first chip.

In one embodiment, the size of the remaining adhesive layer 830 along the direction parallel to the first front surface 821 may be determined according to the size of the second chip 910 along the direction parallel to the first front surface 821. In another embodiment, the size of the remaining adhesive layer 830 along the direction parallel to the first front surface 821 may be determined according to the size of the first chip 810 along the direction parallel to the first front surface 821.

An encapsulation layer 900 may be formed on the first front surface 821 to cover the second chip 910. Further, the encapsulation layer 900 may cover the first front surface 821 exposed by the second chip 910. The detailed descriptions of the second chip and the encapsulation layer may refer to corresponding descriptions in embodiments associated with FIGS. 7-8, and are omitted herein.

The processes after forming the encapsulation layer 900 may be the same as or similar to the disclosed embodiments associated with FIGS. 9-14, and are not repeated herein.

Figure 18:
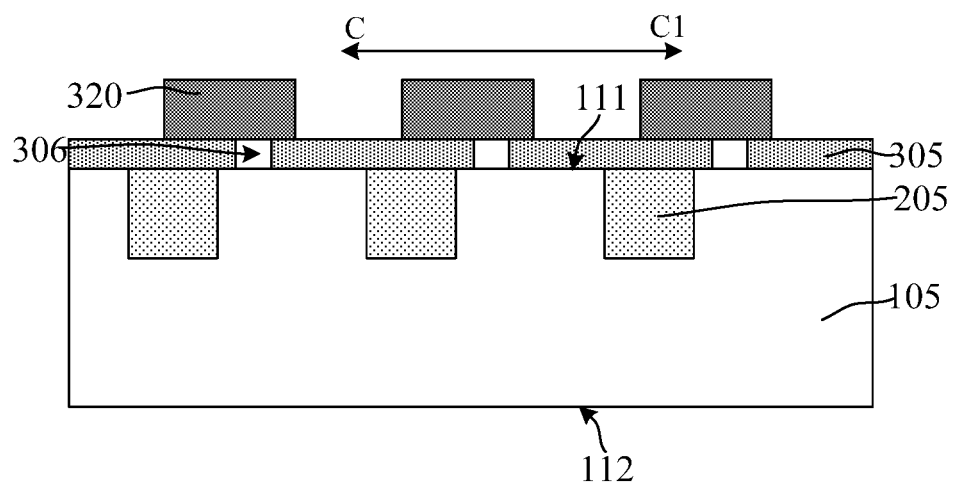
FIG. 18 illustrates an exemplary package structure consistent with various disclosed embodiments of the present disclosure.

The present disclosure also provides a package structure. FIG. 18 illustrates an exemplary package structure consistent with various disclosed embodiments of the present disclosure. Referring to FIG. 18, the package structure may include a device wafer 105, an adhesive layer 305, and a plurality of second chips 320 bonded to the device wafer 105. The device wafer 105 may include a first front surface 111 having a plurality of first chips 205 integrated therein and a first back surface 112 opposing the first front surface 111. The adhesive layer 305 may be formed on the first front surface 111 of the device wafer 105, and may have a plurality of first through-holes 306 exposing the first front surface 111. The second chip may be disposed on the adhesive layer 305. The second chip may be in one-to-one correspondence with the first through-hole 306 and may cover the top of the first through-hole 306.

The device wafer 105 may be a wafer for completing a device fabrication, and the device wafer 105 may be used as a wafer to be integrated in a packaging process. In one embodiment, the device wafer 105 may be adaptable to implementing a wafer-level system-in-package. The wafer-level system-in-package may refer to a technique of integrating a plurality of components with different functions, e.g., active components, passive components, micro-electromechanical systems, and optical components, etc., into one device wafer, and cutting the one device wafer to obtain individual packaged products. The wafer-level system-in-package may be featured with advantages such as high efficiency, high density, small size, high yield and desired electrothermal performance, therefore, the ever-increasing packaging process requirements may be satisfied.

In certain embodiments, the device wafer may be adaptable to implementing a wafer-level packaging process. The wafer-level packaging may refer to a technique of directly performing most or all of the packaging test procedures on the device wafer, and then cutting the device wafer to obtain individual finished chips.

The adhesive layer 305 may be made of an adhesive material, and may be used to implement adhesive bonding of the device wafer 105 to the second chip 320. The adhesive layer 305 may have a plurality of first through-holes 306 exposing the first front surface 111. The first through-hole 306 may be used to provide a spatial location for forming a conductive plug electrically connected to the second chip 320.

In one embodiment, the adhesive layer 305 may be made of an adhesive material capable of photolithography. Therefore, the adhesive layer 305 may be patterned by exposure and development processes to form the first through-hole 306. Accordingly, the use of an additional etching process may be avoided and the process steps of forming the first through-hole 306 may be simplified, which may facilitate to reduce the process cost and to improve the packaging efficiency. Moreover, patterning the adhesive layer 305 by the exposure and development processes may not affect the viscosity of adhesive layer 305.

In one embodiment, the material of the adhesive layer 305 may be a dry film. In certain embodiments, the adhesive layer may be made of polyimide, polybenzoxazole (PBO), or benzocyclobutene (BCB), etc.

A thickness (not labeled) of the adhesive layer 305 cannot be too small or too large. If the thickness of the adhesive layer 305 is too small, the adhesive layer 305 may be insufficient to achieve the adhesive bonding of the device wafer 105 to the second chip 320. If the thickness of the adhesive layer 305 is too large, the process difficulty for forming the first through-hole 306 may increase accordingly, and the process resources and time may be wasted. Therefore, in one embodiment, the thickness of the adhesive layer 305 may be in a range of approximately 5 µm-100 µm according to actual process requirements.

In one embodiment, the first through-hole 306 may be used to provide a spatial location for forming a conductive plug electrically connected to the second chip 320. Therefore, a projection of the first through-hole 306 onto the first front surface 111 may be located on a side of the first chip 205, to avoid bridge connection between the conductive plug electrically connected to the second chip 320 and the first chip 205. To achieve the normal use function of the package structure, according to the actual process requirements, the first through-holes 306 may be in one-to-one correspondence with the first chips 205. The one-to-one correspondence between the first through-holes 306 and the first chips 205 may refer to that a quantity of the first through-holes 306 is equal to a quantity of the first chips 205, and the first through-hole 306 and the first chip 205 have a preset relative positional relationship.

In one embodiment, to reduce the process difficulty and process cost of patterning the adhesive layer 305, after patterning the adhesive layer 305, the remaining adhesive layer 305 may expose the first front surface 111 at a location corresponding to the first through-hole 306.

In one embodiment, an extension direction of the first through-hole 306 may be a first direction, and a direction perpendicular to the first direction and a normal direction of the first front surface 111 may be a second direction (illustrated as CC1 in FIG. 18).

The second chip 320 may be used as a chip to be integrated in a WLSiP packaging process. The plurality of second chips 320 may have at least one type of function.

In one embodiment, the plurality of second chips 320 may have multiple types of functions, and a quantity of the second chips 320 may be equal to the quantity of the first chips 205. A wafer-level system-in-package scheme may be realized by integrating the plurality of second chips 320 with different functions into one package structure. In certain embodiments, when the device wafer is adaptable to implementing a wafer-level packaging process, the plurality of second chips may have a same type of function.

The second chips 320 may be fabricated using integrated circuit fabrication techniques. In one embodiment, the second chip 320 may be a memory chip, a communication chip, a processor, or a logic chip, etc. In certain embodiments, the second chip may be any other suitable functional chip.

In one embodiment, the first through-hole 306 may be used to provide a spatial location for forming a conductive plug electrically connected to the second chip 320. Correspondingly, the second chips 320 may be in one-to-one correspondence with the first through-holes 306. The one-to-one correspondence between the second chips 320 and the first through-holes 306 may refer to that the quantity of the first through-holes 306 is equal to the quantity of the second chips 320, and the second chip 320 covers the top of the first through-hole 306.

The plurality of second chips 320 may have different functions. The plurality of second chips 320 may be obtained by cutting a plurality of device wafers with different functions. The second chip 320 may often include an NMOS device, a PMOS device, or any other suitable semiconductor device formed on a semiconductor substrate, and may further include a dielectric layer, a metal interconnection structure, and a bonding pad, etc.

In one embodiment, the second chip 320 may include a second front surface (not labeled) having semiconductor devices formed thereon and a second back surface (not labeled) opposing the second front surface. Further, the second back surface may refer to a bottom surface of the semiconductor substrate on a side away from the bonding pad. Accordingly, according to actual process requirements, one of the second front surface and the second back surface of the second chip 320 may be disposed on the adhesive layer 305.

To realize the electrical connection between the second chip 320 and other circuits, the package structure may often include a conductive plug electrically connected to the second chip 320 in the device wafer 105 and the first through-hole 306. Accordingly, the packaging process of the package structure may often include etching the first back surface 112 of the device wafer 105 to form a second through-hole penetrating the first through-hole 306 in the device wafer 105.

According to the disclosed package structure, in the packaging process of the package structure, the first through-hole 306 may be first formed, and then the device wafer 105 may be etched to form the second through-hole. The opening size of the first through-hole 306 along the second direction may be determined by the patterning process of the adhesive layer 305, such that the opening size of the first through-hole 306 along the second direction may meet the process requirements. Therefore, compared to the method of sequentially etching the device wafer and the adhesive layer to successively form the first through-hole in the device wafer and the second through-hole penetrating the first through-hole in the adhesive layer, in the present disclosure, the issue of serious lateral etching of the first through-hole 306 may be prevented, and the issue of the opening size of the first through-hole 306 along the second direction being larger than the opening size of the second through-hole along the second direction may be prevented. Therefore, the formation quality of the conductive plug in the first through-hole 306 may be improved, thereby improving the electrical connection performance of the conductive plug to the second chip 320. Accordingly, the performance and reliability of the package structure may be optimized.

The package structure may be formed by the disclosed packaging method associated with FIG. 20, or may be formed by any other suitable packaging method. The detailed descriptions of the package structure may refer to corresponding descriptions in the embodiments associated with FIGS. 5-14, and are omitted herein.

Figure 19:
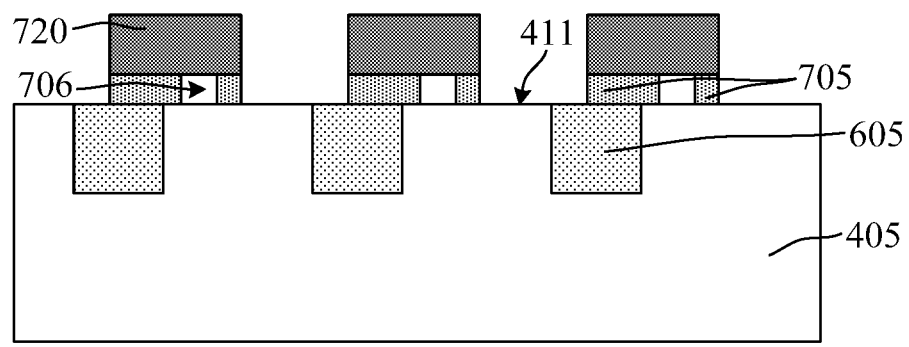
FIG. 19 illustrates another exemplary package structure consistent with various disclosed embodiments of the present disclosure.

FIG. 19 illustrates another exemplary package structure consistent with various disclosed embodiments of the present disclosure. The same or similar features of the embodiments in the present disclosure and the embodiments associated with FIG. 18 are not repeated herein, while certain difference may include the following. Referring to FIG. 19, an adhesive layer 705 may cover a first front surface 411 at a location corresponding to a second chip 720. A first through-hole 706 in the adhesive layer 705 may expose a partial first front surface 411 at the location corresponding to the second chip 720.

Correspondingly, when the package structure further includes an encapsulation layer covering the second chip 720, the encapsulation layer may cover the first front surface 411 exposed by the second chip 720. Therefore, the encapsulation layer may have a desired contact with the first front surface 411 and may effectively function as insulation, seal, and moisture proof.

In one embodiment, to realize adhesive bonding of the device wafer 405 to the second chip 720, the adhesive layer 705 may cover the first front surface 411 at the location corresponding to the second chip 720. The first through-hole 706 may be in one-to-one correspondence with the second chip 720. The first through-hole 706 may be used to provide a spatial location for forming a conductive plug electrically connected to the second chip 720.

The one-to-one correspondence between the first through-hole 706 and the second chip 720 may refer to that a quantity of the first through-holes 706 is equal to a quantity of the second chips 720, and the second chip 720 may cover the top of the first through-hole 706.

In one embodiment, the adhesive layer 705 may cover at least a portion of a first chip 605. Therefore, the spacing between the corresponding first chip 605 and the second chip 720 in a direction parallel to the first front surface 411 may be reduced, which may facilitate to improve process integration degree. In certain embodiments, the adhesive layer may be on the first front surface on a side of the first chip.

In one embodiment, the size of the adhesive layer 705 along the direction parallel to the first front surface 411 may be determined according to the size of the second chip 720 along the direction parallel to the first front surface 411. In another embodiment, the size of the adhesive layer 705 along the direction parallel to the first front surface 411 may be determined according to the size of the first chip 605 along the direction parallel to the first front surface 411.

The package structure may be formed by the disclosed packaging method associated with FIG. 21, or may be formed by any other suitable packaging method. The detailed descriptions of the package structure may refer to corresponding descriptions in the embodiments associated with FIGS. 15-17 and FIGS. 9-14, and are omitted herein.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A wafer-level system-in-package (WLSiP) package structure, comprising:
   a device wafer, wherein the device wafer includes a first front surface having a plurality of first chips integrated therein and a first back surface opposing the first front surface;
   an adhesive layer, formed on the first front surface of the device wafer, wherein the adhesive layer includes a plurality of through-holes exposing the first front surface; and
   a plurality of second chips, bonded to the device wafer, wherein the plurality of second chips are bonded with the adhesive layer to cover the plurality of first through-holes in a one-to-one correspondence.

2. The package structure according to claim 1, wherein:
   the second chip includes a second front surface having semiconductor devices formed thereon and a second back surface opposing the second front surface; and
   one of the second front surface and the second back surface is bonded with the adhesive layer.

3. The package structure according to claim 1, wherein:
   the adhesive layer is made of one of a dry film, polyimide, polybenzoxazole, and benzocyclobutene.

4. The package structure according to claim 1, wherein:
   the adhesive layer exposes the first front surface at a location corresponding to the through-hole; or
   the adhesive layer covers the first front surface at a location corresponding to the second chip.

5. The package structure according to claim 1, wherein:
   the plurality of second chips have at least one type of function.

\* \* \* \* \*